United States Patent
Kim et al.

(10) Patent No.: US 11,314,315 B2
(45) Date of Patent: Apr. 26, 2022

(54) PERFORMANCE CONTROL OF A DEVICE WITH A POWER METERING UNIT (PMU)

(71) Applicant: Samsung Electronics Co., Ltd., Suwon-si (KR)

(72) Inventors: Young Deok Kim, San Jose, CA (US); Pyeongwoo Lee, Sunnyvale, CA (US); Sumanth Jannyavula Venkata, Fremont, CA (US)

(73) Assignee: SAMSUNG ELECTRONICS CO., LTD.

( * ) Notice: Subject to any disclaimer, the term of this patent is extended or adjusted under 35 U.S.C. 154(b) by 0 days.

(21) Appl. No.: 16/803,947

(22) Filed: Feb. 27, 2020

(65) Prior Publication Data
US 2021/0223851 A1 Jul. 22, 2021

Related U.S. Application Data

(60) Provisional application No. 62/962,918, filed on Jan. 17, 2020.

(51) Int. Cl.
| | |
|---|---|
| *G06F 1/324* | (2019.01) |
| *G06F 1/3234* | (2019.01) |
| *G06F 1/3206* | (2019.01) |
| *G01R 21/133* | (2006.01) |
| *G06F 1/26* | (2006.01) |

(52) U.S. Cl.
CPC ......... *G06F 1/3268* (2013.01); *G01R 21/133* (2013.01); *G06F 1/266* (2013.01); *G06F 1/324* (2013.01); *G06F 1/3206* (2013.01)

(58) Field of Classification Search
CPC ...... G06F 1/3268; G06F 1/266; G06F 1/3206; G06F 1/324; G01R 21/133
See application file for complete search history.

(56) References Cited

U.S. PATENT DOCUMENTS

| | | |
|---|---|---|
| 8,904,209 B2 | 12/2014 | Davis et al. |
| 9,063,732 B2 | 6/2015 | Byom et al. |
| 9,244,519 B1 * | 1/2016 | Ellis ..................... G06F 1/3253 |

(Continued)

FOREIGN PATENT DOCUMENTS

WO 2008083906 A2 7/2008

*Primary Examiner* — Gary Collins
(74) *Attorney, Agent, or Firm* — Renaissance IP Law Group LLP

(57) ABSTRACT

Inventive aspects include a device including storage media. The device includes a PMU, and a controller communicatively coupled to the PMU. The PMU determines that an operating power of the device exceeds a threshold, and transmits a signal to the controller to trigger a power reduction operation. The controller throttles one or more operations until the operating power goes below the threshold. Some embodiments include a method for controlling performance of a storage device. The method includes measuring, by a PMU, a power consumption associated with a storage device. The method includes determining, by the PMU, whether the power consumption is greater than a threshold. In response, the method may include setting a performance throttle. The method may include determining, by the PMU, whether the power consumption is less than the threshold. In response, the method may include releasing the performance throttle.

20 Claims, 9 Drawing Sheets

(56) References Cited

U.S. PATENT DOCUMENTS

| | | | |
|---|---|---|---|
| 9,395,790 B2 | 7/2016 | Berke et al. | |
| 9,502,082 B1 | 11/2016 | Dang et al. | |
| 9,760,311 B1* | 9/2017 | Amir | G06F 3/0616 |
| 2008/0059822 A1 | 3/2008 | Choi et al. | |
| 2009/0198385 A1 | 8/2009 | Oe et al. | |
| 2011/0060927 A1* | 3/2011 | Fillingim | G06F 11/1441 |
| | | | 713/320 |
| 2014/0059359 A1* | 2/2014 | Bahirat | G06F 1/3253 |
| | | | 713/300 |
| 2016/0372160 A1* | 12/2016 | Lehmann | G06F 1/329 |
| 2017/0031409 A1* | 2/2017 | Lester | G06F 3/0653 |
| 2017/0040884 A1* | 2/2017 | Fang | G06F 1/3237 |

* cited by examiner

PERFORMANCE CONTROL OF A DEVICE WITH A POWER METERING UNIT (PMU)

RELATED APPLICATION DATA

This application claims the benefit of U.S. Provisional Application Ser. No. 62/962,918, filed on Jan. 17, 2020, which is hereby incorporated by reference.

TECHNICAL AREA

The present embodiments relate to storage systems, and more particularly, to systems and methods for controlling the performance of a device using a power metering unit (PMU).

BACKGROUND

Systems that include a storage device can have a limited power budget. In other words, a fixed amount of power may be available to a particular system, and therefore, the storage device is limited by the fixed amount of power. The performance of the storage device can be statically controlled such that the storage device does not exceed the power budget. However, such static control limits the performance of the storage device to an unnecessary degree, particularly at a low queue depth. Consequently, the storage device may perform at a level beneath where it may otherwise operate.

BRIEF SUMMARY

Inventive aspects include a device including storage media. The device may include a PMU, and a controller communicatively coupled to the PMU. The PMU may be configured to determine that an operating power of the device exceeds a threshold, and transmit a signal to the controller to trigger a power reduction operation. The controller may be configured to throttle one or more operations until the operating power goes below the threshold.

Some embodiments include a device having a storage enclosure. The storage enclosure may include one or more solid state drives (SSDs) each having storage media. The storage enclosure may include a PMU. The storage enclosure may include a storage throttle controller communicatively coupled to the PMU. The PMU may be configured to determine that an operating power of the storage enclosure exceeds a predefined power level threshold, and transmit a signal to the storage throttle controller to trigger a power reduction operation. The storage throttle controller may be configured to throttle one or more operations associated with the storage enclosure until the operating power goes below the predefined power level threshold.

Some embodiments include a method for controlling performance of a storage device. The method may include measuring, by a PMU, a power consumption associated with a storage device. The method may include determining, by the PMU, whether the power consumption is greater than a threshold. In response to determining by the PMU that the power consumption is greater than the threshold, the method may include setting a performance throttle. The method may include determining, by the PMU, whether the power consumption is less than the threshold. In response to determining by the PMU that the power consumption is less than threshold, the method may include releasing the performance throttle.

BRIEF DESCRIPTION OF THE DRAWINGS

The foregoing and additional features and advantages of the present inventive principles will become more readily apparent from the following detailed description, made with reference to the accompanying figures, in which.

DETAILED DESCRIPTION

Figure 1:
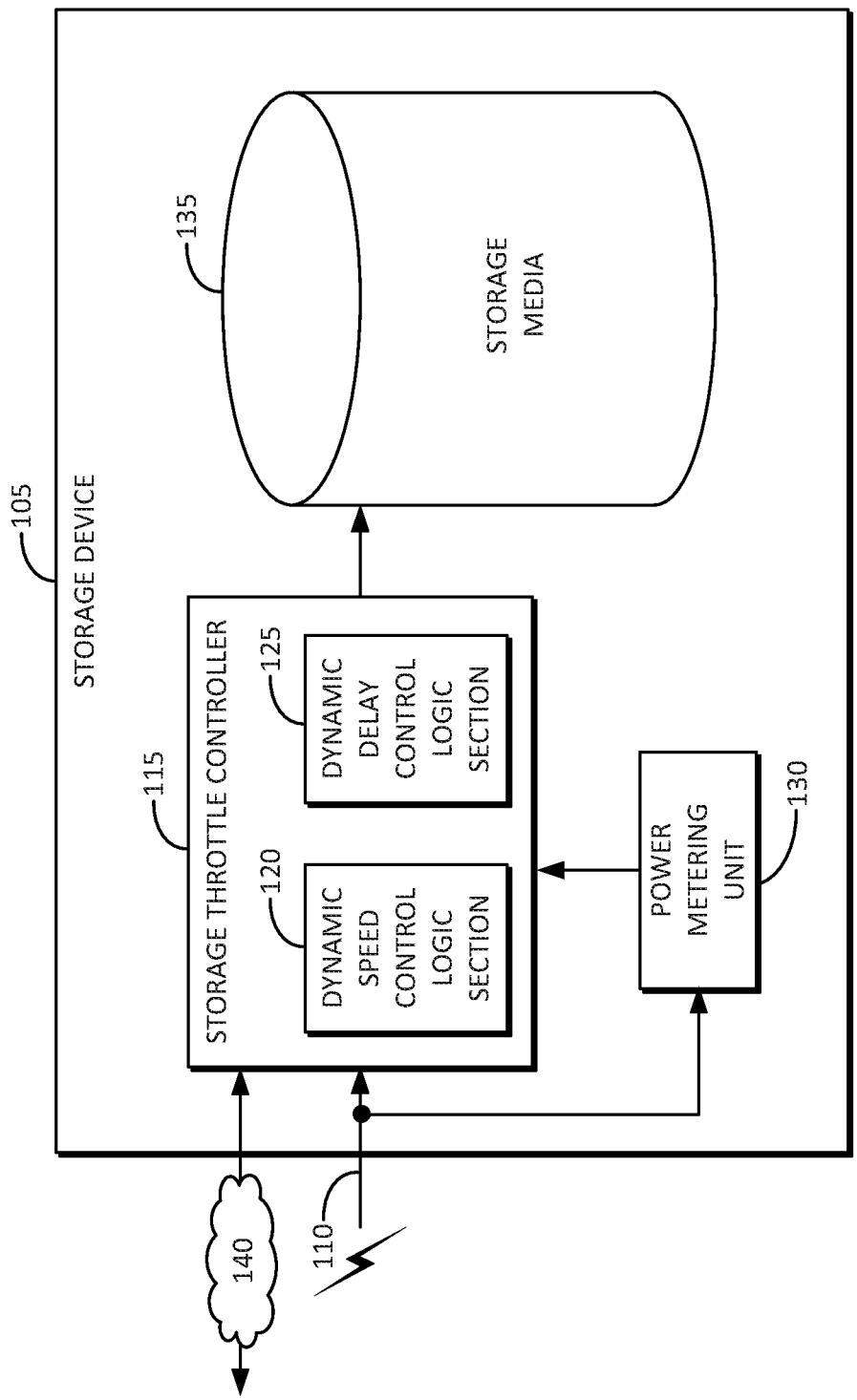
FIG. 1 is an example block diagram of a storage device including a PMU and a storage throttle controller having a dynamic speed control logic section and a dynamic delay control logic section in accordance with some embodiments.

Reference will now be made in detail to embodiments disclosed herein, examples of which are illustrated in the accompanying drawings. In the following detailed description, numerous specific details are set forth to enable a thorough understanding of the inventive concept. It should be understood, however, that persons having ordinary skill in the art may practice the inventive concept without these specific details. In other instances, well-known methods, procedures, components, circuits, and networks have not been described in detail so as not to unnecessarily obscure aspects of the embodiments.

It will be understood that, although the terms first, second, etc. may be used herein to describe various elements, these elements should not be limited by these terms. These terms are only used to distinguish one element from another. For example, a first threshold could be termed a second threshold, and, similarly, a second threshold could be termed a first threshold, without departing from the scope of the inventive concept.

The terminology used in the description of the inventive concept herein is for the purpose of describing particular embodiments only and is not intended to be limiting of the inventive concept. As used in the description of the inventive concept and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The components and features of the drawings are not necessarily drawn to scale.

Performance of a storage device may need to be throttled to meet a power budget even though the storage device can achieve higher performance absent any power budget limit. For example, the performance of the storage device can be affected by reducing an operating clock speed associated with the device, or by placing a delay on an operation of the device to throttle performance and meet the power budget. The throttling can be performed in a dynamic fashion such that a balance between high performance and operating within a power budget limit may be achieved.

Reducing operating clock speed or otherwise imposing a delay can increase latency, even when the storage device does not reach the limit defined by the power budget. For example, the latency can be increased at a low queue depth with the power limit due to an intentionally delayed operation or a lowered clock speed. Some embodiments disclosed herein may control a power mode dynamically by using a PMU associated with the storage device.

FIG. 1 is an example block diagram of a storage device 105 including a PMU 130 and a storage throttle controller 115 having a dynamic speed control logic section 120 and a dynamic delay control logic section 125 in accordance with some embodiments. The storage device 105 may include storage media 135. The storage media 135 may include volatile and/or non-volatile memory. The storage media 135 may include, for example, flash memory, dynamic access random memory (DRAM), or the like. In some embodiments, the storage device 105 may be an SSD, an embedded multi-media controller (eMMC), a storage class memory (SCM), or the like. The storage device 105 may receive power from a power line 110. The storage throttle controller 115, the PMU 130, and the storage media 135 may receive power from the power line 110.

Operating power of the storage device 105 may be monitored using the PMU 130. When power consumption of the storage device 105 reaches a predefined threshold during operation, then the PMU 130 may notify the storage throttle controller 115 so that the storage throttle controller 115 may start throttling performance of the storage media 135 to keep within a power budget. For example, the PMU 130 may transmit a signal to the storage throttle controller 115 to trigger a power reduction operation. The storage throttle controller 115 may throttle one or more storage operations 140 until the operating power of the storage device 105 goes below the predefined power level threshold.

More specifically, the dynamic speed control logic section 120 of the storage throttle controller 115 may dynamically reduce or increase the operating clock speed of the storage media 135. Alternatively or in addition, the dynamic delay control logic section 125 of the storage throttle controller 115 may dynamically cause one or more delays to one or more storage operations 140 associated with the storage media 135. The storage operations 140 may include a read operation, a write operation, or other commands associated with input/outputs (IOs). The dynamic delay control logic section 125 may also dynamically remove the one or more delays to the storage operations 140. The dynamic delay control logic section 125 may also dynamically adjust a length of the one or more delays to the storage operations 140. In other words, the dynamic delay control logic section 125 may dynamically increase and/or decrease the length of the one or more delays. Accordingly, the dynamic speed control logic section 120 and/or the dynamic delay control logic section 125 of the storage throttle controller 115 may dynamically throttle the performance of the storage media 135 to meet the power budget.

Based on some embodiments disclosed herein, the storage device 105 can provide an improved or optimized latency during a low-performance state, and can meet the power budget when the storage device 105 approaches or reaches the limit on the power budget during a high and/or maximum performance state. The storage device 105 may control a power mode dynamically by using the PMU 130.

In some embodiments, the throttling may be triggered by the PMU 130, and the PMU 130 may cause an interrupt. The storage throttle controller 115 associated with the storage device 105 may enter a throttling state using an adjusting clock speed or by putting a delay on the one or more storage operations 140.

In some embodiments, the operating power of the storage device 105 may be measured by the PMU 130, and when the power consumption of the storage device 105 reaches the predefined threshold during operation, then the PMU 130 may notify the controller 115 so that the controller 115 can start throttling performance to keep the storage device 105 and/or modules within the storage device 105 within the power budget.

The throttling may be triggered by the PMU 130, for example, by issuing an interrupt. The controller 115 associated with the storage device 105 may enter a throttling mode by adjusting a clock speed or by putting a delay on the storage operations 140 of at least certain modes of the storage device.

Figure 2:
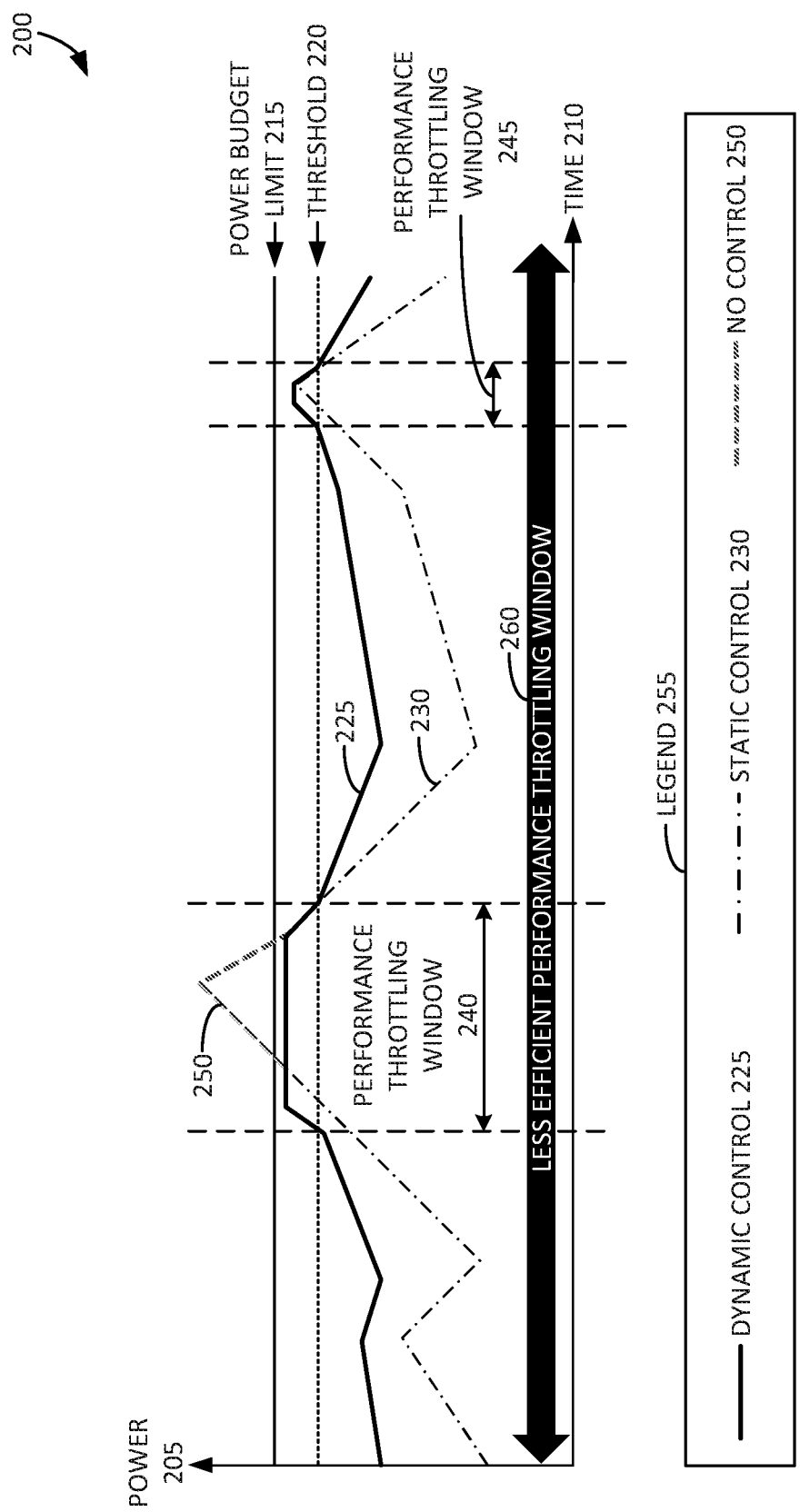
FIG. 2 is an example graph diagram showing example details of performance characteristics of the storage device of FIG. 1 in accordance with some embodiments.

FIG. 2 is an example graph diagram 200 showing example details of performance characteristics of the storage device 105 of FIG. 1 in accordance with some embodiments. The Y-axis of the diagram 200 indicates a level of power 205. The X-axis of the diagram 200 indicates a progression of time 210. The power budget limit 215 is indicated as an upper horizontal line. The threshold 220 is a predefined power level threshold and is indicated by a horizontal line beneath the power budget limit 215. A legend 255 includes three different forms of data lines of the diagram 200 including a dynamic control 225 line, a static control 230 line, and a no control line 250. As can be seen in FIG. 2, the power levels over time of storage device (e.g., 105 of FIG. 1) are shown.

The dynamic control 225 line indicates one embodiment in which the performance of the storage device (e.g., 105 of FIG. 1) is dynamically throttled. For example, the storage throttle controller (e.g., 115 of FIG. 1) may dynamically throttle storage operations (e.g., 140 of FIG. 1) of the storage media (e.g., 135 of FIG. 1) during a performance throttling window 240 of time and a performance throttling window 245 of time. Put differently, the storage throttle controller (e.g., 115 of FIG. 1) may reduce the operating clock speed of the storage media (e.g., 135 of FIG. 1) and/or may introduce one or more delays to the storage operations (e.g., 140 of FIG. 1) during the performance throttling windows (e.g., 240 and/or 245). This is indicated by plateaus of the dynamic control 225 line during the performance throttling windows (e.g., 240 and/or 245). In contrast, the static control 230 line is below the dynamic control 225 line, meaning that with a static control approach, performance throttling is applied more consistently, which can result in a wider, less efficient performance throttling window 260. In the case of no control 250 of the power levels of the storage device, the power level may increase above the power budget limit 215

(e.g., as indicated by the no control 250 line), thereby violating the power budget limit.

The operating power of the storage device (e.g., 105 of FIG. 1) may be measured via an interaction with the PMU (e.g., 130 of FIG. 1). When power consumption of the storage device 105 reaches the predefined threshold 220, then the PMU may notify the controller (e.g., 115 of FIG. 1) so that the controller can start throttling performance of the storage media (e.g., 135 of FIG. 1) to keep below the power budget limit 215. The controller may throttle performance in a dynamic way dependent on information from the PMU. Accordingly, the amount of throttling can be reduced to discrete performance throttling windows (e.g., 240 and 245), such that the storage throttle controller (e.g., 115 of FIG. 1) prevents the operating power from rising above the power budget limit 215.

Figure 3:
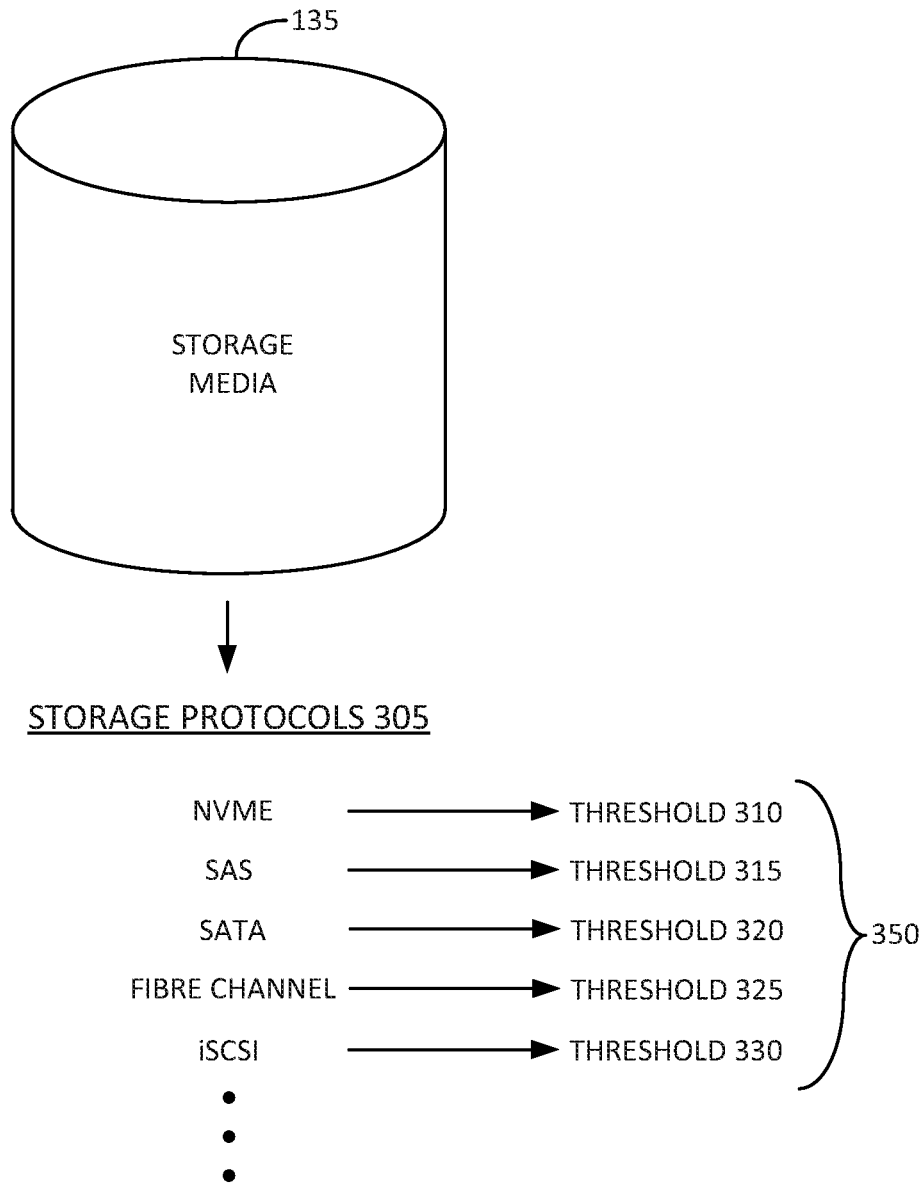
FIG. 3 is an example diagram showing different storage protocols and corresponding thresholds in accordance with some embodiments.

FIG. 3 is an example diagram showing different storage protocols 305 and corresponding power level thresholds 350 in accordance with some embodiments. One or more storage protocols 305 may be used. The storage protocols 305 may include non-volatile memory express (NVME), serial attached SCSI (SAS), serial ATA (SATA), Fibre Channel, Internet Small Computer Systems Interface (iSCSI), or the like. Each of the storage protocols 305 may have a corresponding threshold 350 associated therewith. For example, threshold 310 may be associated with the NVME protocol, threshold 315 may be associated with the SAS protocol, threshold 320 may be associated with the SATA protocol, threshold 325 may be associated with the Fibre Channel protocol, threshold 330 may be associated with the iSCSI protocol, and so forth.

The power budget limit (e.g., 215 of FIG. 2) may be different depending on the particular storage protocol 350 being used with the storage device (e.g., 105 of FIG. 1). The various power level thresholds 350 may therefore be selected based on the I/O characteristics and/or power budget limit associated with of each of the storage protocols 305. For example, the threshold 310 for the NVME protocol may be higher than the threshold 315 for the SAS protocol. Each of the power level thresholds 350 can be predefined or otherwise set based on the particular storage protocol being used so that the storage device (e.g., 105 of FIG. 1) remains below the power budget level (e.g., 215 of FIG. 2), while reducing an amount of time that the storage device is throttled.

Figure 4:
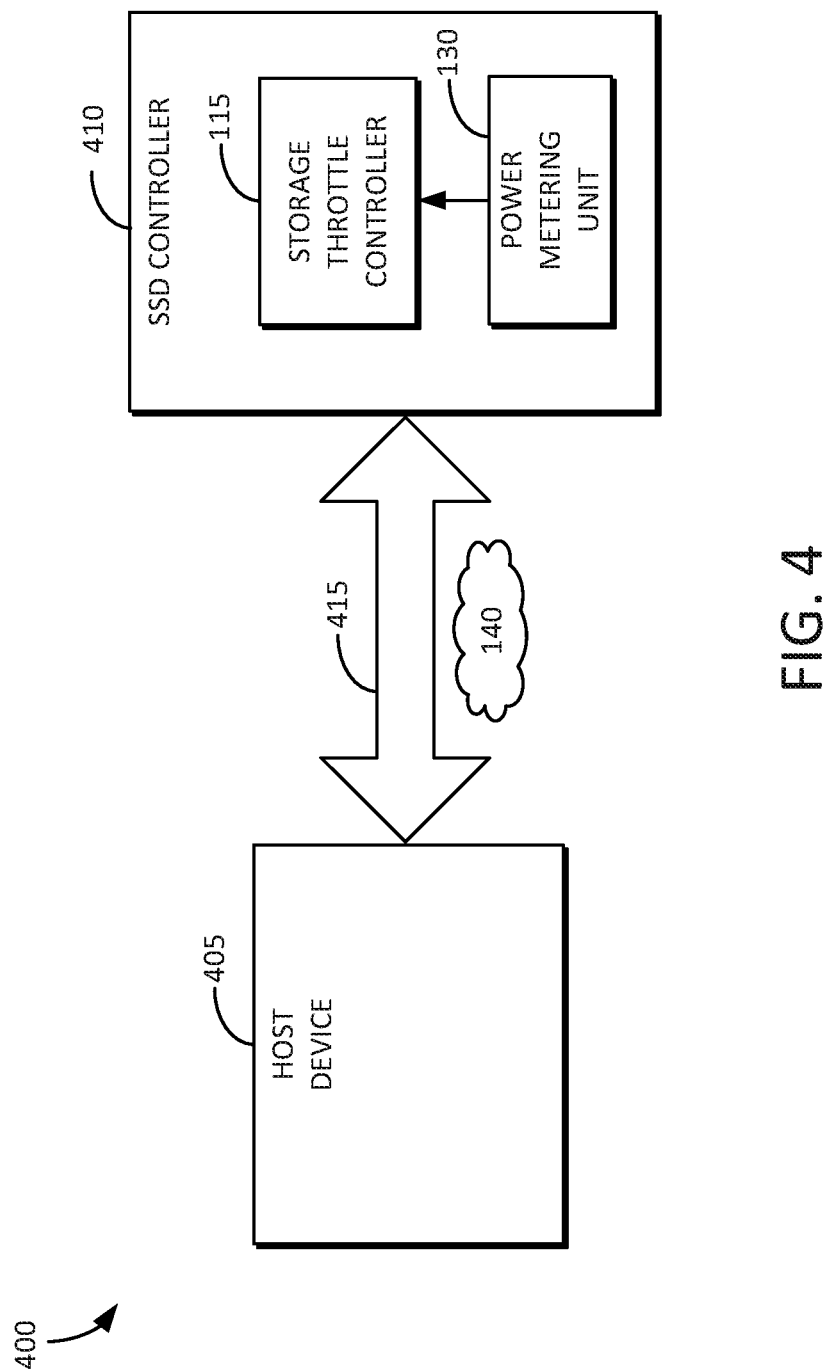
FIG. 4 is an example block diagram including a host device and an SSD controller having a PMU and a storage throttle controller in accordance with some embodiments.

FIG. 4 is an example block diagram 400 including a host device 405 and an SSD controller 410 having a PMU 130 and a storage throttle controller 115 in accordance with some embodiments. The host device 405 may be communicatively coupled to the SSD controller 410 via a communication line 415. The communication line 415 may be a communication bus, a wire, a cable, a network, or the like. The host device 405 may send storage operations 140 such as read and write requests to the SSD controller 410. The SSD controller 410 may cause data to be written to or read from storage media (e.g., 135 of FIG. 1). The storage throttle controller 115 and the PMU 130 may throttle the storage operations 140 in a manner that is described in detail above. In some embodiments, when the PMU 130 notifies the storage throttle controller 115 that the power consumption of the SSD controller 410 and associated storage media (e.g., 135 of FIG. 1) have reached the predefined threshold, then the storage throttle controller 115 can cause the SSD controller 410 and/or the storage media to enter a throttling mode, as described in detail above. The power level threshold for the SSD controller 410 may be the same as or different from the power level threshold for other types of storage media. For the sake of brevity, a detailed description of the throttling techniques is not repeated.

Figure 5:
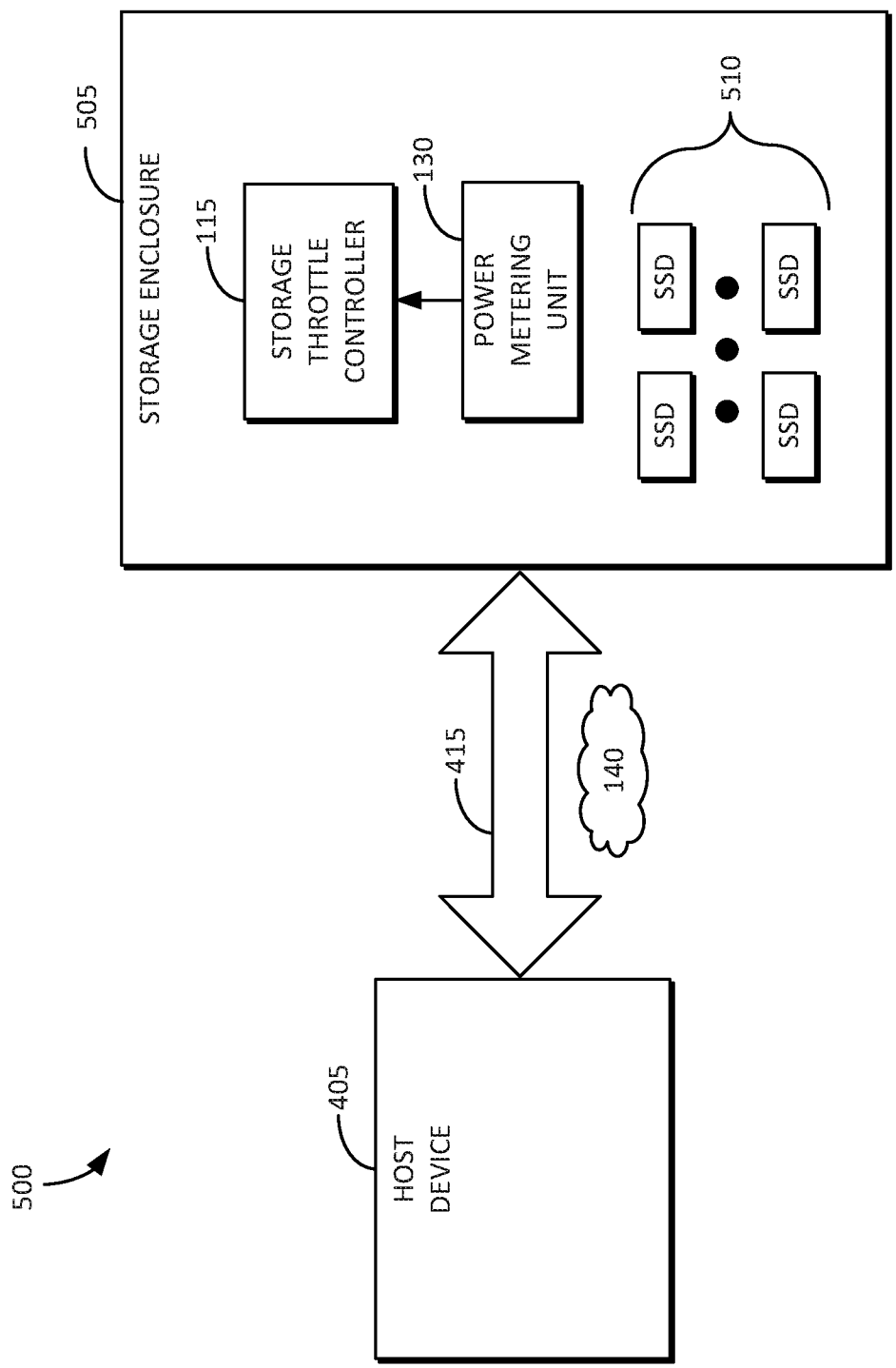
FIG. 5 is an example block diagram of a host device and a storage enclosure having a PMU and a storage throttle controller in accordance with some embodiments.

FIG. 5 is an example block diagram 500 of a host device 405 and a storage enclosure 505 having a PMU 130 and a storage throttle controller 115 in accordance with some embodiments. The storage enclosure 505 may include one or more storage devices (e.g., SSDs 510). The PMU 130 and/or the storage throttle controller 115 can be located at any suitable location with respect to the storage device or storage devices. For example, the PMU 130 and/or the storage throttle controller 115 may be located in storage enclosure 505 but outside of and separate from the actual storage devices (e.g., SSDs 510). One PMU 130 and one storage throttle controller 115 may be used to throttle the storage operations 140 for each of the storage devices (e.g., SSDs 510). In some embodiments, when the PMU 130 notifies the storage throttle controller 115 that the power consumption of the storage enclosure 505 has reached the predefined threshold, then the storage throttle controller 115 can cause one or more of the storage devices (e.g., SSDs 510) to enter a throttling mode, as described in detail above.

The host device 405 may be communicatively coupled to the storage enclosure 505 via a communication line 415. The communication line 415 may be a communication bus, a wire, a cable, a network, or the like. The host device 405 may send storage operations 140 such as read and write requests to the storage enclosure 505. The storage enclosure 505 may cause data to be written to or read from storage media of the SSDs 510. The storage throttle controller 115 and the PMU 130 may throttle the storage operations 140 in a manner that is described in detail above. The power level threshold for the storage enclosure 505 may be the same as or different from the power level threshold for a storage device such as an SSD. For the sake of brevity, a detailed description of the throttling techniques is not repeated.

Figure 6:
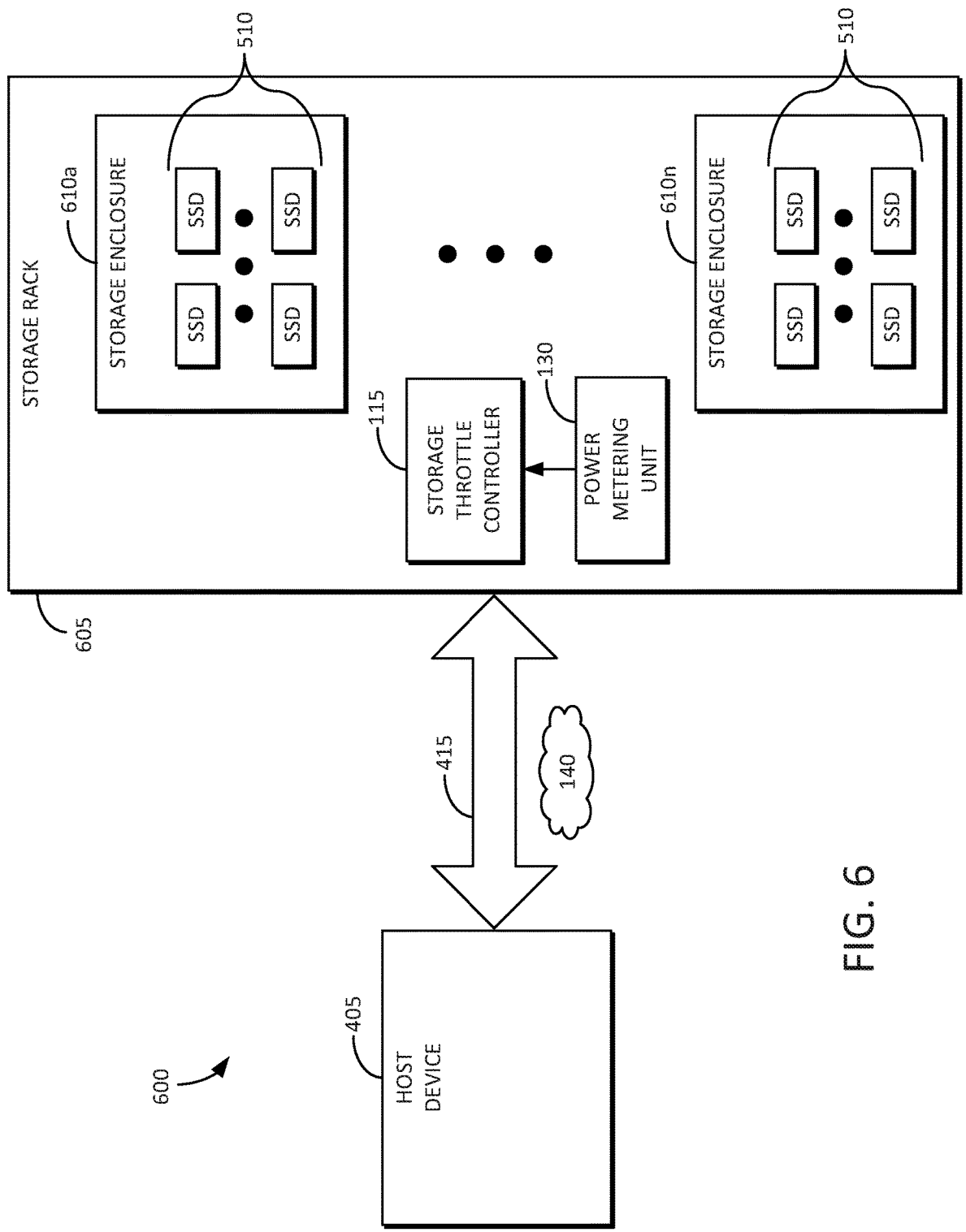
FIG. 6 is an example block diagram of a host device and a storage rack having a PMU and a storage throttle controller in accordance with some embodiments.

FIG. 6 is an example block diagram 600 of a host device 405 and a storage rack 605 having a PMU 130 and a storage throttle controller 115 in accordance with some embodiments. The storage rack 605 may include one or more storage enclosures (e.g., 610a through 610n). Each of the storage enclosures may include one or more storage devices (e.g., SSDs 510). The PMU 130 and/or the storage throttle controller 115 can be located at any suitable location with respect to the storage enclosures and storage devices. For example, the PMU 130 and/or the storage throttle controller 115 may be located in the storage rack 605 but outside of and separate from the actual storage enclosures (e.g., 610a through 610n). In some embodiments, the PMU 130 and the storage throttle controller 115 may be located within one of the storage enclosures, and throttle all of the storage operations 140 for all of the storage enclosures of the storage rack 605. In some embodiments, one PMU 130 and one storage throttle controller 115 may be used to throttle the storage operations 140 for each of the storage devices (e.g., SSDs 510) of each of the storage enclosures (e.g., 610a through 610n). In some embodiments, when the PMU 130 notifies the storage throttle controller 115 that the power consumption of the storage rack 605 has reached the predefined threshold, then the storage throttle controller 115 can cause one or more of the storage devices (e.g., SSDs 510) of one or more storage enclosures (e.g., 610a through 610n) to enter a throttling mode, as described in detail above.

The host device 405 may be communicatively coupled to the storage rack 605 via a communication line 415. The communication line 415 may be a communication bus, a wire, a cable, a network, or the like. The host device 405 may send storage operations 140 such as read and write requests to the storage rack 605. The storage rack 605 may cause data to be written to or read from storage media of the SSDs 510 of the storage enclosures (e.g., 610a through 610n). The storage throttle controller 115 and the PMU 130 may throttle the storage operations 140 in a manner that is described in detail above. The power level threshold for the storage rack 605 may be the same as or different from the power level threshold for a storage enclosure or a storage device such as an SSD. For the sake of brevity, a detailed description of the throttling techniques is not repeated.

Figure 7:
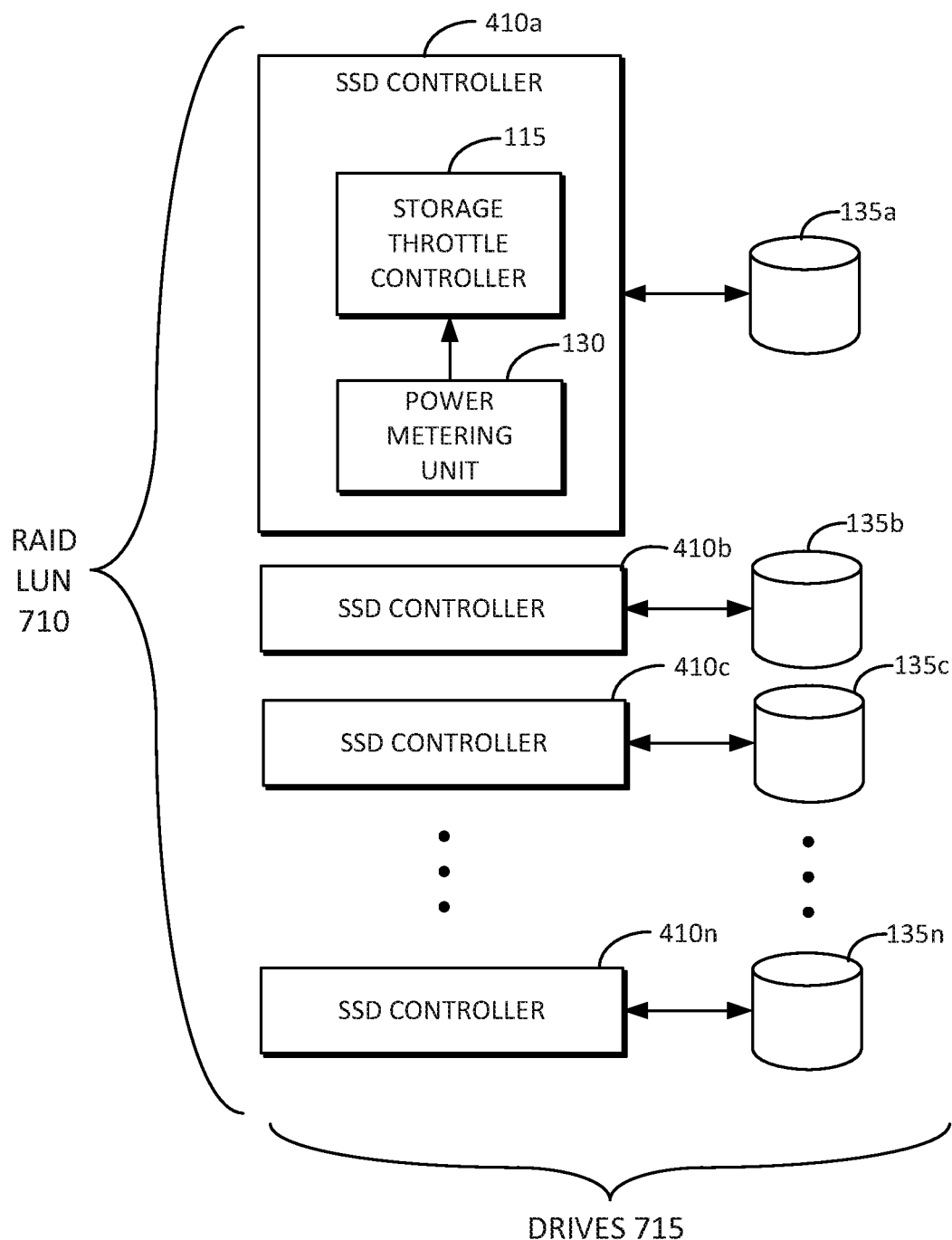
FIG. 7 is an example block diagram of a redundant array independent drive (RAID) logical unit number (LUN) including an SSD controller having a PMU and a storage throttle controller in accordance with some embodiments.

FIG. 7 is an example block diagram of a redundant array independent drive (RAID) logical unit number (LUN) 710 including an SSD controller 410a having a PMU 130 and a storage throttle controller 130 in accordance with some embodiments. The RAID LUN 710 may include two or more storage drives 715. Each of the storage drives 715 may include, for example, an SSD controller (e.g., 410a through 410n) and corresponding storage media (e.g., 135a through 135n).

One or more of the storage drives 715 of the RAID LUN 710 may include a PMU 130 and a storage throttle controller 115. The PMU 130 and/or the storage throttle controller 115 can be located at any suitable location with respect to the storage drives 715. For example, the PMU 130 and/or the storage throttle controller 115 may be located in one of the storage drives (e.g., 410a/135a) but outside of and separate from the other storage drives 715. In some embodiments, the PMU 130 and the storage throttle controller 115 may be located within one of the storage drives, and throttle all of the storage operations (e.g., 140 of FIG. 1) for all of the storage drives 715. In some embodiments, each of the storage drives 715 includes its own PMU 130 and storage throttle controller 115. In some embodiments, when the PMU 130 notifies the storage throttle controller 115 that the power consumption of the RAID LUN 710 has reached the predefined threshold, then the storage throttle controller 115 can cause one or more of the storage drives 715 to enter a throttling mode, as described in detail above.

The storage throttle controller 115 and the PMU 130 may throttle the storage operations 140 in a manner that is described in detail above. The power level threshold for the RAID LUN 710 may be the same as or different from the power level threshold for a storage enclosure or a storage device such as an SSD. For the sake of brevity, a detailed description of the throttling techniques is not repeated.

Figure 8:
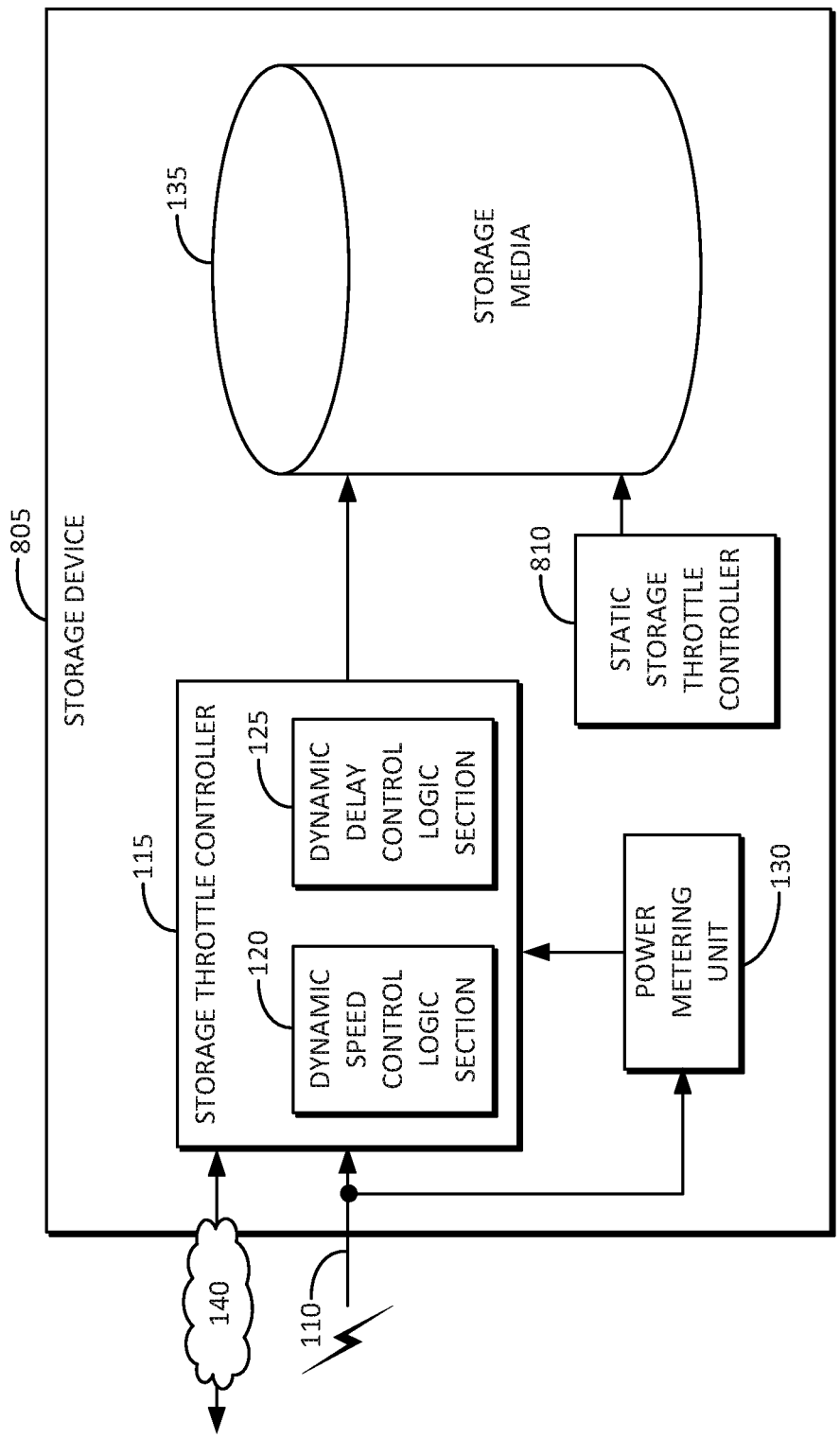
FIG. 8 is an example block diagram of a hybrid storage device including a PMU, a storage throttle controller having a dynamic speed control logic section and a dynamic delay control logic section, and a static storage throttle controller in accordance with some embodiments.

FIG. 8 is an example block diagram of a hybrid storage device 805 including a PMU 130, a storage throttle controller 115 having a dynamic speed control logic section 120 and a dynamic delay control logic section 125, and a static storage throttle controller 810 in accordance with some embodiments. The hybrid storage device 805 may operate in similar fashion to the storage device 105 described above, but with the added capability of running in a static throttle configuration during some of the operating time of the storage device 805. The storage device 805 may be configured by the user to run in either a dynamic storage throttling mode using the PMU 130 and the storage throttle controller 115, or in a static storage throttling mode using the static storage throttle controller 810. The storage device 805 may be configured to run in a hybrid mode in which some of the storage operations 140 are throttled in a dynamic fashion, and some of the storage operations 140 are throttled in a static fashion. For the sake of brevity, a detailed description of the throttling techniques is not repeated.

Figure 9:
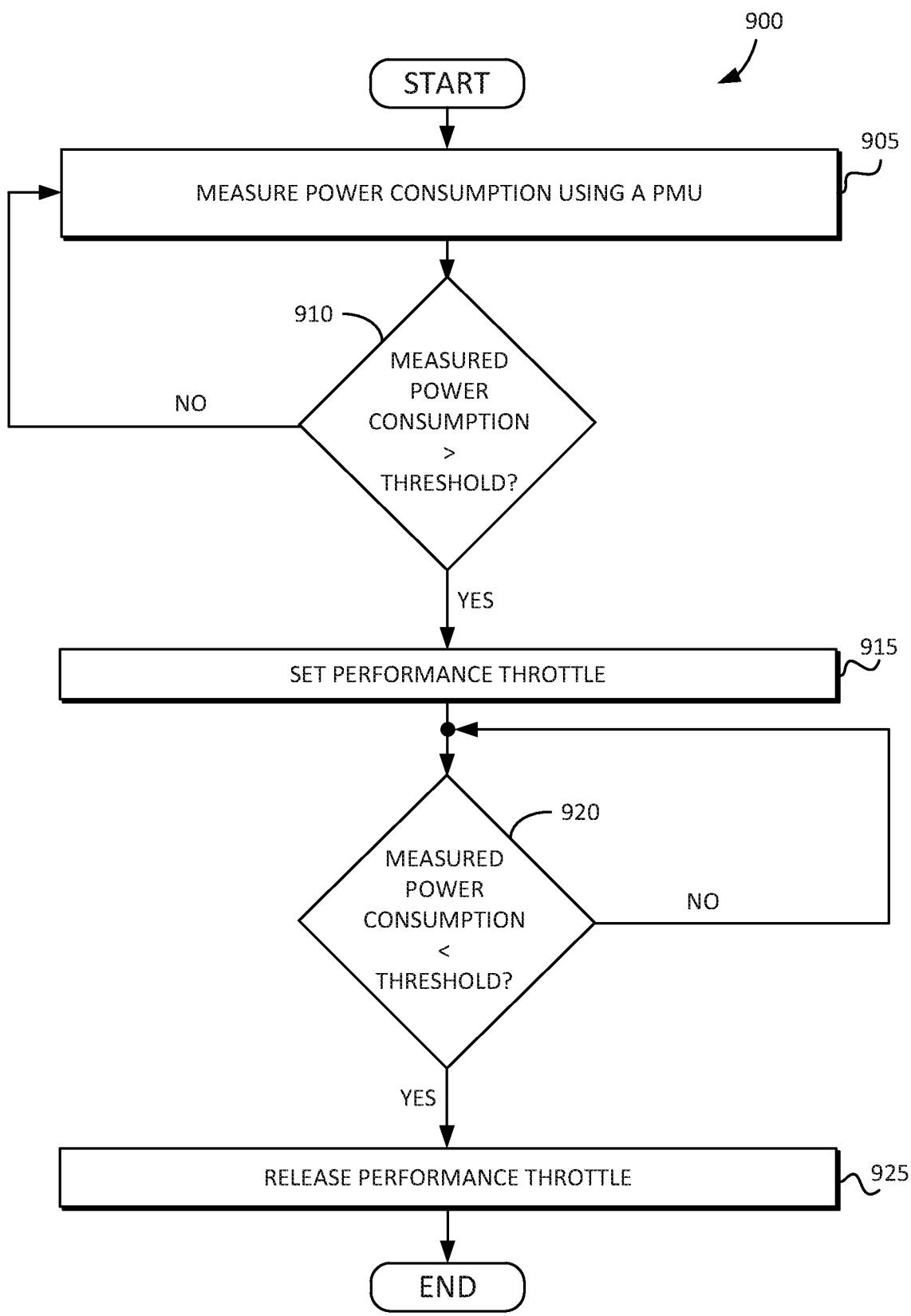
FIG. 9 is a flow diagram showing a technique for dynamically controlling performance of a device using a PMU in accordance with some embodiments.

FIG. 9 is a flow diagram 900 showing a technique for dynamically controlling performance of a device using a PMU in accordance with some embodiments. At 905, power consumption of a device may be measured using a PMU. The device may be a storage-related device such as those described in detail above. At 910, a determination can be made whether the measured power consumption is greater than a predefined power level threshold. In some embodiments, the PMU may make the determination. When it is determined that the measured power consumption is greater than the predefined power level threshold, then the flow can proceed to 915. Otherwise, the flow may return to 905 for further measuring.

At 915, a performance throttle may be set. For example, the PMU may notify a storage controller, and the storage controller may throttle performance of storage media to stay within a particular power budget. At 920, a determination can be made whether the measured power consumption is less than the power level threshold. In some embodiments, the PMU may make the determination. When it is determined that the measured power consumption is less than the predefined power level threshold, then the flow can proceed to 925. Otherwise, the flow may continue to measure the power consumption and check against the threshold at 920. At 925, the performance throttle may be released. For example, the PMU may notify the storage controller, and the storage controller may stop throttling the performance of the storage media.

Inventive aspects disclosed herein include a device including storage media. The device may include a PMU, and a controller communicatively coupled to the PMU. The PMU may be configured to determine that an operating power of the device exceeds a threshold, and transmit a signal to the controller to trigger a power reduction operation. The controller may be configured to throttle one or more operations responsive to the signal dependent on the operating power going below the threshold. The controller may be configured to throttle one or more operations responsive to the signal until the operating power goes below the threshold. The device may include an SSD including the storage media, the PMU, and the controller. The threshold may be a predefined power level threshold associated with the SSD.

In some embodiments, the controller may include a dynamic speed control logic section that may be configured to dynamically reduce an operating clock speed dependent on the operating power going below the threshold. In some embodiments, the controller may include a dynamic speed control logic section that may be configured to dynamically reduce an operating clock speed until the operating power goes below the threshold. In some embodiments, the controller may include a dynamic delay control logic section that may be configured to dynamically delay the one or more operations dependent on the operating power going below the threshold. In some embodiments, the controller may include a dynamic delay control logic section that may be configured to dynamically delay the one or more operations until the operating power goes below the threshold. In some embodiment, controller may be configured to throttle the one or more operations within one or more discrete performance throttling windows. In some embodiment, controller may be configured to throttle the one or more operations during one or more discrete performance throttling windows. The controller may be configured to maintain the operating power below a power budget limit. In some embodiments, the controller may be configured to prevent the operating power from rising above a power budget limit. In some embodiments, the controller is a storage throttle controller. In some embodiments, the one or more operations includes at least one of a storage write operation or a storage read operation.

In some embodiments, the storage media may be associated with a first storage protocol and a second storage protocol. In some embodiments, the threshold is a first threshold. In some embodiments, the signal is a first signal. In some embodiments, the PMU may be configured to determine that the operating power of the device exceeds a second threshold, and transmit a second signal to the controller to trigger the power reduction operation. In some embodiments, the controller may be configured to throttle the one or more operations associated with the first protocol in response to the first signal until the operating power goes below the first threshold. In some embodiments, the controller may be configured to throttle the one or more operations associated with the second protocol in response to the second signal until the operating power goes below the second threshold.

Some embodiments include a device having a storage enclosure. The storage enclosure may include including one or more SSDs each having storage media. The storage enclosure may include a PMU. The storage enclosure may include a storage throttle controller communicatively coupled to the PMU. The PMU may be configured to determine that an operating power of the storage enclosure exceeds a predefined power level threshold, and transmit a signal to the storage throttle controller to trigger a power reduction operation. The storage throttle controller may be configured to throttle one or more operations associated with the storage enclosure dependent on the operating power going below the predefined power level threshold. The storage throttle controller may be configured to throttle one or more operations associated with the storage enclosure until the operating power goes below the predefined power level threshold.

In some embodiments, the storage throttle controller may include a dynamic speed control logic section that may be configured to dynamically reduce an operating clock speed dependent on the operating power going below the predefined power level threshold. In some embodiments, the storage throttle controller may include a dynamic speed control logic section that may be configured to dynamically reduce an operating clock speed until the operating power goes below the predefined power level threshold. In some embodiments, the storage throttle controller may be configured to prevent the operating power from rising above a power budget limit associated with the storage enclosure. In some embodiments, the one or more operations includes at least one of a storage write operation or a storage read operation.

In some embodiments, a first subset of the SSDs may be associated with a first storage protocol. In some embodiments, a second subset of the SSDs may be associated with a second storage protocol. In some embodiments, the threshold is a first threshold. In some embodiments, the signal is a first signal. In some embodiments, the PMU may be configured to determine that the operating power of the storage enclosure exceeds a second threshold, and transmit a second signal to the storage throttle controller to trigger the power reduction operation. In some embodiments, the storage throttle controller may be configured to throttle the one or more operations associated with the first protocol in response to the first signal until the operating power goes below the first threshold. In some embodiments, the storage throttle controller may be configured to throttle the one or more operations associated with the second protocol in response to the second signal until the operating power goes below the second threshold.

Some embodiments include a method for controlling performance of a storage device. The method may include measuring, by a PMU, a power consumption associated with a storage device. The method may include determining, by the PMU, whether the power consumption is greater than a threshold. In response to determining by the PMU that the power consumption is greater than the threshold, the method may include setting a performance throttle. The method may include determining, by the PMU, whether the power consumption is less than the threshold. In response to determining by the PMU that the power consumption is less than threshold, the method may include releasing the performance throttle.

In some embodiments, setting may further include setting, by a controller, the performance throttle. In some embodiments, setting the performance throttle may include dynamically reducing an operating clock speed dependent on the measured power consumption going below the threshold. In some embodiments, releasing may further include releasing, by the controller, the performance throttle. In some embodiments, setting the performance throttle may include dynamically reducing an operating clock speed until the measured power consumption goes below the threshold. In some embodiments, setting the performance throttle may include dynamically delaying one or more operations dependent on the measured power consumption goes below the threshold. In some embodiments, setting the performance throttle may include dynamically delaying one or more operations until the measured power consumption goes below the threshold.

The various operations of methods described above may be performed by any suitable means capable of performing the operations, such as various hardware and/or software component(s), circuits, and/or module(s).

The blocks or steps of a method or algorithm and functions described in connection with the embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art.

The following discussion is intended to provide a brief, general description of a suitable machine or machines in which certain aspects of the inventive concept can be implemented. Typically, the machine or machines include a system bus to which is attached processors, memory, e.g., RAM, ROM, or other state preserving medium, storage devices, a video interface, and input/output interface ports. The machine or machines can be controlled, at least in part, by input from conventional input devices, such as keyboards, mice, etc., as well as by directives received from another machine, interaction with a virtual reality (VR) environment, biometric feedback, or other input signal. As used herein, the term "machine" is intended to broadly encompass a single machine, a virtual machine, or a system of communicatively coupled machines, virtual machines, or devices operating together. Exemplary machines include computing devices such as personal computers, workstations, servers, portable computers, handheld devices, telephones, tablets, etc., as well as transportation devices, such as private or public transportation, e.g., automobiles, trains, cabs, etc.

The machine or machines can include embedded controllers, such as programmable or non-programmable logic devices or arrays, Application Specific Integrated Circuits (ASICs), embedded computers, smart cards, and the like. The machine or machines can utilize one or more connections to one or more remote machines, such as through a network interface, modem, or other communicative coupling. Machines can be interconnected by way of a physical and/or logical network, such as an intranet, the Internet, local area networks, wide area networks, etc. One skilled in the art will appreciate that network communication can utilize various wired and/or wireless short range or long range carriers and protocols, including radio frequency (RF), satellite, microwave, Institute of Electrical and Electronics Engineers (IEEE) 545.11, Bluetooth®, optical, infrared, cable, laser, etc.

Embodiments of the present disclosure can be described by reference to or in conjunction with associated data including functions, procedures, data structures, application programs, etc. which when accessed by a machine results in the machine performing tasks or defining abstract data types or low-level hardware contexts. Associated data can be stored in, for example, the volatile and/or non-volatile memory, e.g., RAM, ROM, etc., or in other storage devices and their associated storage media, including hard-drives, floppy-disks, optical storage, tapes, flash memory, memory sticks, digital video disks, biological storage, etc. Associated data can be delivered over transmission environments, including the physical and/or logical network, in the form of packets, serial data, parallel data, propagated signals, etc., and can be used in a compressed or encrypted format. Associated data can be used in a distributed environment, and stored locally and/or remotely for machine access.

Having described and illustrated the principles of the present disclosure with reference to illustrated embodiments, it will be recognized that the illustrated embodiments can be modified in arrangement and detail without departing from such principles, and can be combined in any desired manner. And although the foregoing discussion has focused on particular embodiments, other configurations are contemplated. In particular, even though expressions such as "according to an embodiment of the inventive concept" or the like are used herein, these phrases are meant to generally reference embodiment possibilities, and are not intended to limit the inventive concept to particular embodiment configurations. As used herein, these terms can reference the same or different embodiments that are combinable into other embodiments.

Embodiments of the present disclosure may include a non-transitory machine-readable medium comprising instructions executable by one or more processors, the instructions comprising instructions to perform the elements of the inventive concepts as described herein.

The foregoing illustrative embodiments are not to be construed as limiting the inventive concept thereof. Although a few embodiments have been described, those skilled in the art will readily appreciate that many modifications are possible to those embodiments without materially departing from the novel teachings and advantages of the present disclosure. Accordingly, all such modifications are intended to be included within the scope of this present disclosure as defined in the claims.

What is claimed is:

1. A device, comprising:
a non-transitory computer-readable storage media;
a power metering unit (PMU); and
a controller communicatively coupled to the PMU;
wherein the PMU is configured to:
   measure an operating power of the device;
   determine that the operating power of the device exceeds a threshold; and
   transmit a signal to the controller to trigger a power reduction operation; and
wherein the controller is configured to throttle one or more operations based on the signal and dependent on the operating power going below the threshold,
wherein:
   the storage media is associated with a first storage protocol and a second storage protocol;
   the threshold is a first threshold;
   the signal is a first signal;
   the PMU is configured to:
   determine that the operating power of the device exceeds a second threshold; and
   transmit a second signal to the controller to trigger the power reduction operation;
wherein the controller is configured to throttle the one or more operations associated with the first storage protocol based on the first signal dependent on the operating power going below the first threshold; and
wherein the controller is configured to throttle the one or more operations associated with the second storage protocol based on the second signal dependent on the operating power going below the second threshold.

2. The device of claim 1, further comprising at least one of 1) a solid state drive (SSD) or 2) a non-volatile storage, including the storage media, the PMU, and the controller, wherein the threshold is a predefined power level threshold associated with the at least one of 1) the SSD or 2) the non-volatile storage.

3. The device of claim 1, wherein the controller includes a dynamic speed control logic section that is configured to dynamically reduce an operating clock speed dependent on the operating power going below the threshold.

4. The device of claim 1, wherein the controller includes a dynamic delay control logic section that is configured to dynamically delay the one or more operations dependent on the operating power going below the threshold.

5. The device of claim 1, wherein the controller is configured to throttle the one or more operations within one or more discrete performance throttling windows.

6. The device of claim 1, wherein the controller is configured to maintain the operating power below a power budget limit.

7. The device of claim 1, wherein the controller is a storage throttle controller.

8. The device of claim 1, wherein the one or more operations includes at least one of a storage write operation or a storage read operation.

9. The device of claim 1, wherein the PMU is configured to:
   determine that the operating power of the device exceeds a third threshold; and
   transmit a third signal to the controller to trigger the power reduction operation;
   wherein the storage media is associated with a third storage protocol; and
   wherein the controller is configured to throttle the one or more operations associated with the third storage protocol based on the third signal dependent on the operating power going below the third threshold.

10. The device of claim 9, wherein:
the first storage protocol is a non-volatile memory express (NVME) storage protocol;
the second storage protocol is a serial attached SCSI (SAS) storage protocol;
the third storage protocol is a serial ATA (SATA) storage protocol; and
the controller is configured to modify a performance throttle based on determining by the PMU that operating power is less than at least one of the first threshold, the second threshold, or the third threshold.

11. A device, comprising:
a storage enclosure including one or more solid state drives (SSDs) each having a non-transitory computer-readable storage media;
a power metering unit (PMU); and
a storage throttle controller communicatively coupled to the PMU;
wherein the PMU is configured to:
    determine that an operating power of the storage enclosure exceeds a predefined power level threshold; and
    transmit a signal to the storage throttle controller to trigger a power reduction operation; and
wherein the storage throttle controller is configured to throttle one or more operations associated with the storage enclosure dependent on the operating power going below the predefined power level threshold,
wherein:
a first subset of the SSDs is associated with a first storage protocol;
a second subset of the SSDs is associated with a second storage protocol;
the threshold is a first threshold;
the signal is a first signal;
the PMU is configured to:
    determine that the operating power of the storage enclosure exceeds a second threshold; and
    transmit a second signal to the storage throttle controller to trigger the power reduction operation; and
the storage throttle controller is configured to throttle the one or more operations associated with the first protocol based on the first signal dependent on the operating power going below the first threshold; and
the storage throttle controller is configured to throttle the one or more operations associated with the second protocol based on the second signal dependent on the operating power going below the second threshold.

12. The device of claim 11, wherein the storage throttle controller includes a dynamic speed control logic section that is configured to dynamically reduce an operating clock speed dependent on the operating power going below the predefined power level threshold.

13. The device of claim 11, wherein the storage throttle controller includes a dynamic delay control logic section that is configured to dynamically delay the one or more operations dependent on the operating power going below the predefined power level threshold.

14. The device of claim 11, wherein the storage throttle controller is configured to maintain the operating power below a power budget limit associated with the storage enclosure.

15. The device of claim 11, wherein the one or more operations includes at least one of a storage write operation or a storage read operation.

16. A method for controlling storage performance, the method comprising:
measuring, by a power metering unit (PMU), a power consumption associated with a storage device;
determining, by the PMU, the power consumption is greater than a threshold;
based on determining by the PMU the power consumption is greater than the threshold, setting a performance throttle; and
controlling, by a storage controller, based on the setting, an operation of the storage device;
wherein the controlling comprises controlling the operation based on a protocol associated with the operation.

17. The method of claim 16, wherein setting further comprises setting, by a controller, the performance throttle.

18. The method of claim 17, wherein modifying further comprises modifying, by the controller, the performance throttle.

19. The method of claim 16, wherein setting the performance throttle includes dynamically reducing an operating clock speed dependent on the measured power consumption going below the threshold.

20. The method of claim 16, wherein setting the performance throttle includes dynamically delaying one or more operations dependent on the measured power consumption going below the threshold.

* * * * *